(12) United States Patent
Watterson et al.

(10) Patent No.: US 6,594,022 B1
(45) Date of Patent: Jul. 15, 2003

(54) WAVELENGTH REFERENCE DEVICE

(75) Inventors: Reich Watterson, Lexington, MA (US);
Parviz Tayebati, Boston, MA (US);
Kevin McCallion, Boston, MA (US);
Daryoosh Vakhshoori, Cambridge, MA (US)

(73) Assignee: CoreTek, Inc., Billerica, MA (US)

( * ) Notice: Subject to any disclaimer, the term of this patent is extended or adjusted under 35 U.S.C. 154(b) by 0 days.

(21) Appl. No.: 09/644,781

(22) Filed: Aug. 23, 2000

Related U.S. Application Data

(60) Provisional application No. 60/150,246, filed on Aug. 23, 1999.

(51) Int. Cl.$^7$ .................................................. G01B 9/02
(52) U.S. Cl. .................................................... 356/519
(58) Field of Search ................................ 356/352, 454, 356/519

(56) References Cited

U.S. PATENT DOCUMENTS

| | | | | |
|---|---|---|---|---|
| 5,798,859 A | * | 8/1998 | Colbourne et al. | 359/247 |
| 5,825,792 A | * | 10/1998 | Villeneuve et al. | 372/32 |
| 6,233,263 B1 | * | 5/2001 | Chang-Hasnain et al. | 372/32 |

\* cited by examiner

*Primary Examiner*—Frank G. Font
*Assistant Examiner*—Phil Natividad
(74) *Attorney, Agent, or Firm*—Pandiscio & Pandiscio, P.C.

(57) ABSTRACT

A wavelength reference device for tuning a tunable Fabry-Perot filter and/or a tunable VCSEL to a desired frequency, where the device uses a Fizeau interferometer and a position sensitive detector, with the position sensitive detector being used to measure the location of the maximum reflected power from the interferometer, whereby to determine the wavelength of laser radiation for tuning the device.

9 Claims, 4 Drawing Sheets

INTEGRATED VCSEL WAVELENGTH REFERENCE

WAVELENGTH REFERENCE DEVICE

REFERENCE TO PENDING PRIOR PATENT APPLICATION

This patent application claims benefit of pending prior U.S. Provisional Patent Application Ser. No. 60/150,246, filed Aug. 23, 1999 by Reich Watterson et al. for VCSEL INTEGRATED WITH WAVELENGTH REFERENCE, which patent application is hereby incorporated herein by reference.

FIELD OF THE INVENTION

This invention relates to photonic devices in general, and more particularly to tunable filters and tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 5, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable Fabry-Perot filter 5 formed in accordance with the aforementioned U.S. patent applications Ser. Nos. 09/105,399 and 09/543,318. Filter 5 generally comprises a substrate 10, a bottom mirror 20 mounted to the top of substrate 10, a bottom electrode 15 mounted to the top of bottom mirror 20, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, a Fabry-Perot filter is effectively created between top mirror 40 and bottom mirror 20. Furthermore, by applying an appropriate voltage across top electrode 30 and bottom electrode 15, the position of top mirror 40 can be changed relative to bottom mirror 20, whereby to change the length of the Fabry-Perot cavity, and hence tune Fabry-Perot filter 5.

Correspondingly, and looking next at FIG. 2, a tunable vertical cavity surface emitting laser (VCSEL) 50 can be constructed by positioning a gain medium 55 between bottom mirror 20 and bottom electrode 15. As a result, when gain medium 55 is appropriately stimulated, e.g., by optical pumping, lasing can be established within air cavity 45 and gain medium 55, between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune VCSEL 50.

Tunable Fabry-Perot filters and tunable VCSEL's of the type disclosed in the aforementioned U.S. patent applications Ser. Nos. 09/105,399 and 09/543,318 are highly advantageous since they can be quickly and easily tuned by simply changing the voltage applied across the top electrode and the bottom electrode.

However, it has been found that tunable Fabry-Perot filters and tunable VCSEL's of the type disclosed in U.S. patent applications Ser. Nos. 09/105,399 and 09/543,318 have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific frequency. This can present an issue in some applications, particularly telecommunications applications, where the devices may need to be tuned to precise, absolute wavelengths.

SUMMARY OF THE INVENTION

As a result, one object of the present invention is to provide a novel wavelength reference apparatus for calibrating a tunable Fabry-Perot filter and/or a tunable VSCEL, whereby the device may be tuned to a precise, absolute wavelength.

Another object of the present invention is to provide a novel wavelength-locking apparatus for tuning a tunable Fabry-Perot filter and/or a tunable VCSEL to a precise, absolute wavelength, and for thereafter keeping that device tuned to that wavelength.

Still another object of the present invention is to provide a novel method for calibrating a tunable Fabry-Perot filter and/or a tunable VSCEL, whereby the device may be tuned to a precise, absolute wavelength.

Yet another object of the present invention is to provide a novel method for wavelength-locking a tunable Fabry-Perot filter and/or a tunable VCSEL, whereby to tune the device to a precise, absolute wavelength, and for thereafter keeping that device tuned to that wavelength.

In one form of the invention, there is provided a wavelength reference apparatus for use in calibrating a device such as a tunable Fabry-Perot filter or a tunable VCSEL emitting laser radiation to a precise, absolute frequency, the wavelength reference apparatus comprising a collimation device for collimating a portion of the laser radiation, a Fizeau interferometer for receiving the collimated laser radiation, and a position sensitive detector for determining the position of maximum reflected power of the collimated laser radiation from the Fizeau interferometer.

In another form of the invention, there is provided a wavelength-locking apparatus for use in tuning a device such as a tunable Fabry-Perot filter or a tunable VCSEL emitting laser radiation to a precise, absolute frequency, the wavelength locking apparatus comprising a collimation device for collimating a portion of the laser radiation, a Fizeau interferometer for receiving the collimated laser radiation, a position sensitive detector for determining the position of maximum reflected power of the collimated laser radiation from the Fizeau interferometer, and a controller for tuning the wavelength of the device by monitoring the position of maximum reflected power of the collimated laser radiation from the Fizeau interferometer on the position sensitive detector.

In yet another form of the invention, there is provided a method for tuning a device such as a tunable Fabry-Perot filter or a tunable VCSEL emitting laser radiation, comprising the steps of: (1) collimating laser radiation through a collimation device; (2) passing the collimated laser radiation into a Fizeau interferometer; (3) determining the position of maximum reflected power from the Fizeau interferometer;

(4) identifying the frequency of the laser radiation according to the position of maximum reflected power from the Fizeau interferometer; and (5) using the position of the maximum reflected power from the Fizeau interferometer to tune the device to the desired frequency.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
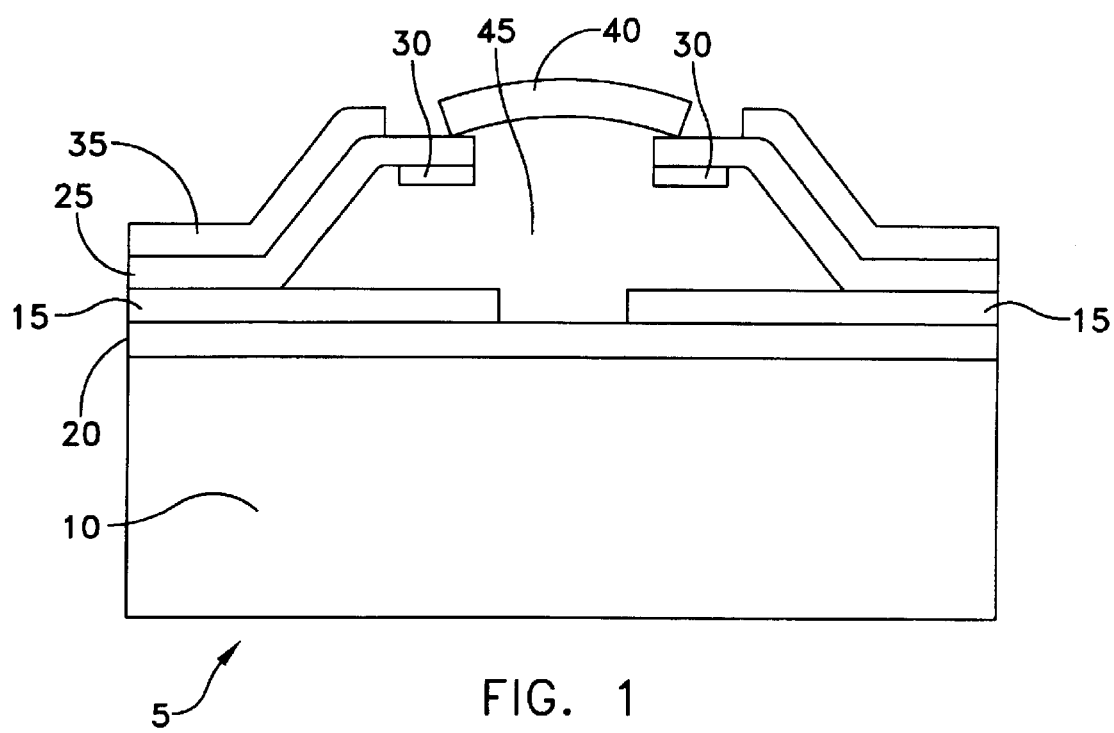
FIG. 1 is a schematic side view of a tunable Fabry-Perot filter.
Figure 2:
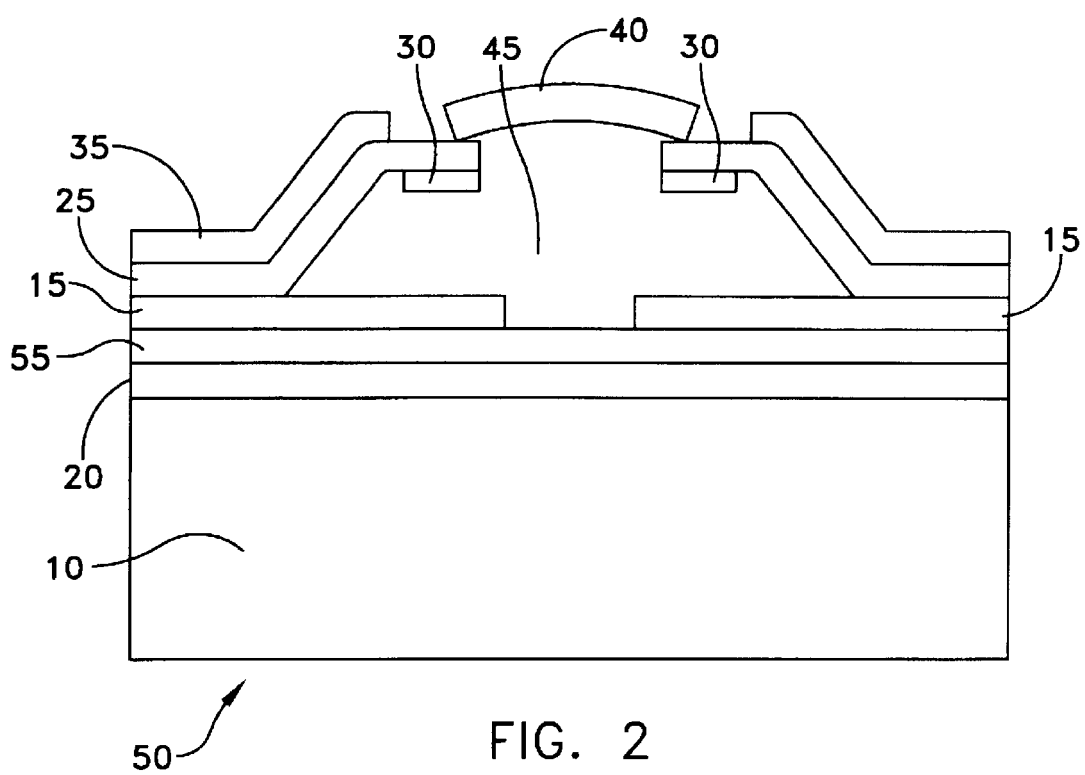
FIG. 2 is a schematic side view of a tunable VCSEL.
Figure 3:
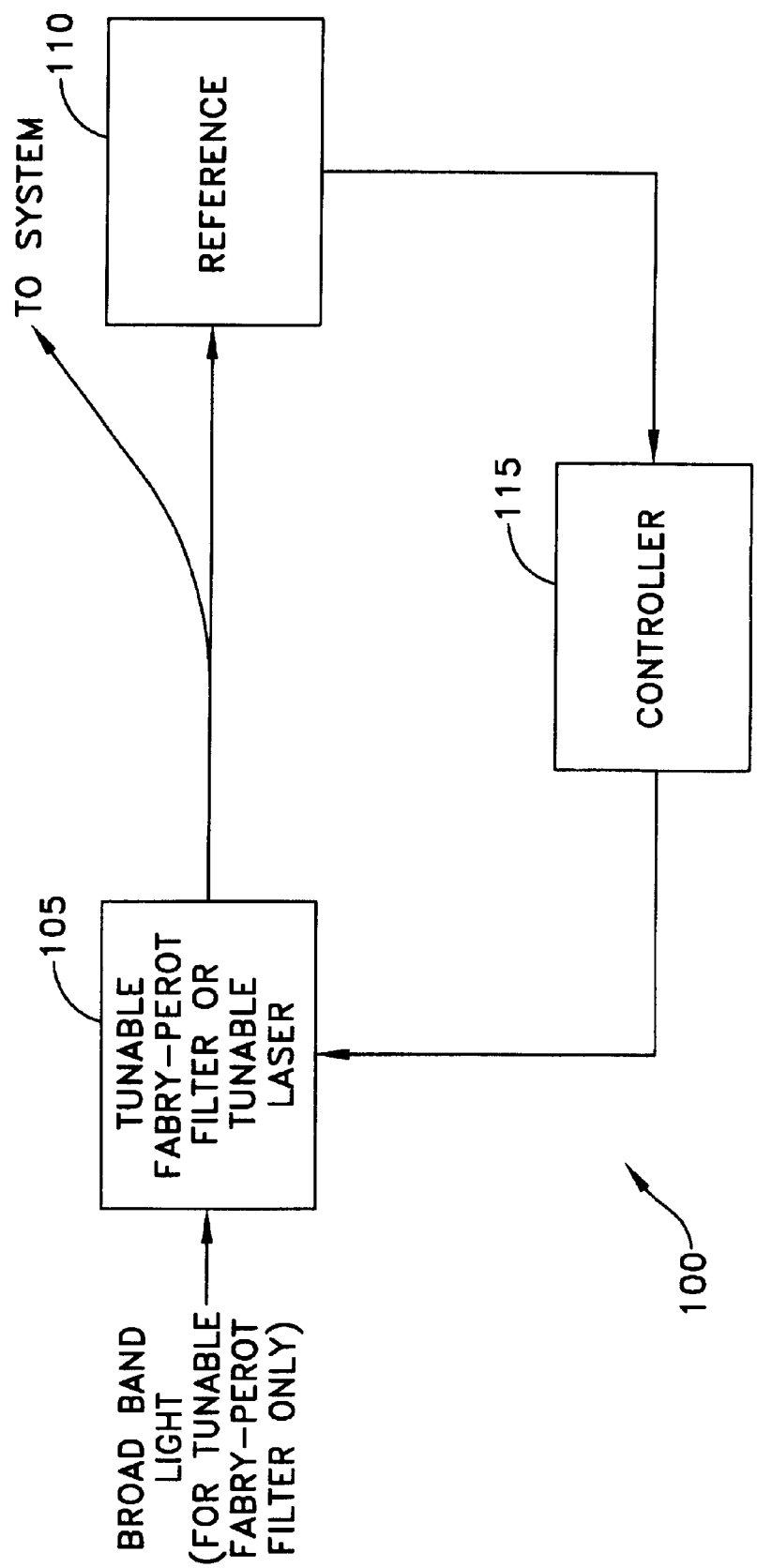
FIG. 3 is a schematic diagram of wavelength reference apparatus and wavelength-locking apparatus for tuning a tunable Fabry-Perot filter and/or a tunable VCSEL to a desired frequency, and for thereafter keeping that device tuned to that frequency.

Looking next at FIG. 3, there is shown a system 100 which provides a wavelength reference apparatus for calibrating a tunable Fabry-Perot filter and/or tunable VCSEL, whereby the device may be tuned to a precise, absolute wavelength. System 100 also provides a wavelength-locking apparatus to keep the tunable Fabry-Perot filter and/or tunable VCSEL tuned to a precise, absolute wavelength.

More particularly, system 100 generally comprises a tunable Fabry-Perot filter or tunable VCSEL 105, a wavelength reference apparatus 110, and a controller 115.

Tunable Fabry-Perot filter or tunable VCSEL 105 preferably comprises a tunable Fabry-Perot filter or tunable VCSEL of the type disclosed in U.S. patent applications Ser. Nos. 09/105,399 and 09/543,318. For convenience of description, tunable device 105 will hereinafter be described in the context of being a tunable VCSEL; however, it will be appreciated that the present invention is equally applicable to the situation where tunable device 105 comprises a tunable Fabry-Perot filter. Of course, using wavelength reference device 110 with a tunable Fabry-Perot filter would require that the tunable filter be illuminated by an external broad band light source (see FIG. 3). This broad band light source could be either optically combined with, or switched with, a normal incoming light signal.

Figure 4:
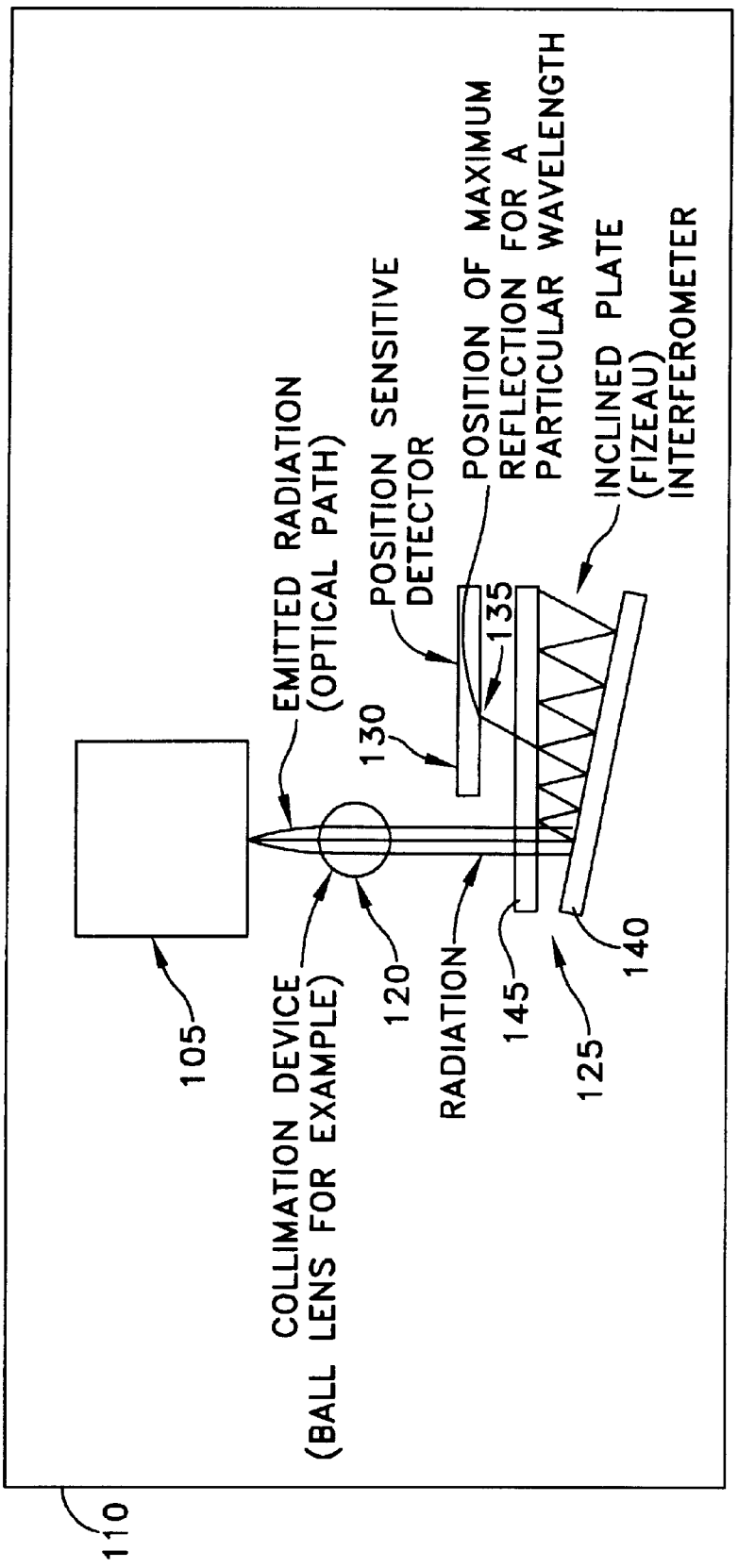
FIG. 4 is a schematic diagram of wavelength reference apparatus formed in accordance with the present invention.

In accordance with a preferred embodiment of the invention, and looking now at FIG. 4, wavelength reference device 110 comprises a collimation device 120, a Fizeau interferometer 125, and a position sensitive detector 130, as will hereinafter be discussed in further detail.

Controller 115 comprises circuitry for reading the output of detector 130 and adjusting the voltage applied to VCSEL 105 so as to tune VCSEL 105 to the desired wavelength, and to thereafter keep it tuned to that wavelength, as will hereinafter be discussed in further detail.

In essence, the tunable Fabry-Perot filter or tunable VCSEL 105 is used to sweep light through wavelength reference device 110 at monotonic wavelengths. This is done by either changing the frequency of the source (i.e., VCSEL 105) or by tuning a tunable optical filter inserted in the optical path. This light is passed through collimation device 120 and into Fizeau interferometer 125. In accordance with the function of a Fizeau interferometer, maximum reflected power will occur at different locations along the axis of the interferometer according to the wavelength of the light entering the interferometer. The position sensitive detector 130 is used to detect the position 135 of maximum reflected power, and hence the absolute wavelength, of the light entering the interferometer. As a result, VCSEL 105 may be tuned to a desired target frequency.

Collimation device 120 is an optical element mounted adjacent to the emitting face of VCSEL 105. This optical element may be a ball lens or a gradient index (GRIN) lens. Collimation device 120 collimates a portion of the laser radiation emitted from VCSEL 105. The collimated laser radiation is then directed to Fizeau interferometer 125.

Fizeau interferometer 125 is preferably mounted within the same housing as VCSEL 105 and receives collimated laser radiation. Fizeau interferometer 125 includes a pair of plates 140, 145 set at an inclination with respect to one another. Plate 140 is set at an inclination with respect to the optical path of emitted radiation from collimation device 120. Plates 140, 145 have a partially reflective coating applied to the inner surfaces facing each other, and have an anti-reflective coating applied to the outer surfaces not facing each other. Collimated laser radiation is reflected between plates 140, 145 and strikes position sensitive detector 130.

Position sensitive detector 130 is located adjacent to Fizeau interferometer 125. Detector 130 is used to determine the position of maximum reflected power along the long axis of plate 145. Detector 130 generates an electrical output based upon the position of the detected radiation.

To determine the wavelength of radiation exiting from the VCSEL, the electrical output of detector 130 is compared to reference electrical signals corresponding to known wavelengths. These reference electrical signals are determined by calibrating wavelength reference device 110 with known wavelengths of collimated radiation. Importantly, these reference electrical signals have a direct correspondence to wavelength which is not dependent on the temperature or age of the system.

An electrical feedback loop provides a signal from position sensitive detector 130 to controller 115. In turn, controller 115 adjusts the tuning voltage applied to VCSEL 105 and hence the wavelength of laser radiation emitted by VCSEL 105.

By way of example but not limitation, suppose that at a given voltage X, VCSEL 105 is generating light with a frequency Y. At this point, the position sensitive detector 130 will detect the position 135 of maximum reflected power at the position which corresponds to the frequency Y. Suppose further that it is desired to tune VCSEL 105 so that it is generating light at a given ITU frequency. In this case, the voltage being applied to VCSEL 105 is adjusted until position sensitive detector 130 detects the position 135 of maximum reflected power at the position which corresponds to the desired target frequency, whereupon VCSEL 105 will be generating light at the desired ITU frequency. Correspondingly, if it is desired to tune VCSEL 105 to another ITU frequency, the voltage being applied to VCSEL 105 is adjusted until the position 135 of maximum reflected power is located at the position which corresponds to the desired ITU frequency, whereupon VCSEL 105 will be generating light at the desired ITU frequency.

Furthermore, once VCSEL 105 has been tuned to the desired target frequency, the position 135 of maximum reflected power on position sensitive detector 130 can be monitored; if the position of maximum reflected power drifts off the desired location (i.e., indicating that VCSEL 105 has drifted off the desired target frequency), the system can adjust the voltage being applied to VCSEL 105 so as to bring the VCSEL back to the desired frequency by driving the output back to the desired wavelength.

As there is a direct correspondence between the position 135 of maximum reflected power and the absolute wavelength of the light being generated by VCSEL 105, temperature compensation is not necessary. Furthermore, by integrating wavelength reference device 110 with VCSEL 105, the system is also thermally stable since the wavelength reference is integral to the thermoelectric temperature control device of VCSEL 105. Therefore, secondary temperature control is not required.

For the purposes of this invention, the detection of the location of maximum reflected power from Fizeau interferometer 125 as the wavelength of the input light is varied (either by direct tuning, i.e., of a tunable laser source, or by the use of a tunable optical filter) will correspond to the identification of the wavelength of the transmitted light.

Numerous advantages are achieved through the use of the present invention.

For one thing, an effective optical wavelength reference is provided in an extremely compact physical layout.

For another thing, an extremely compact VCSEL laser and a wavelength reference device are integrated into a single housing.

In addition, a simple electronics drive circuit is used, which uses the positioning of maximum reflection of laser radiation to determine frequencies.

Furthermore, effective temperature compensation is not necessary as a thermally stable wavelength reference device is provided.

It is to be understood that the present invention is by no means limited to the particular constructions and method steps disclosed above and/or shown in the drawings, but also comprises any modifications or equivalents within the scope of the claims.

What is claimed is:

1. A wavelength reference apparatus for use in calibrating a device such as a tunable Fabry-Perot filter or a tunable VCSEL emitting laser radiation to a precise, absolute frequency, the wavelength reference apparatus comprising:
   a collimation device for collimating a portion of the laser radiation;
   a Fizeau interferometer for receiving the collimated laser radiation, said Fizeau interferometer having a first plate and a second plate, said first plate and said second plate being set at an inclination with respect to one another, and said first plate being set at an inclination with respect to an optical path of said portion of the collimated laser radiation from said collimation device; and
   a position sensitive detector for determining a position of maximum reflected power of the collimated laser radiation along a long axis of said second plate of said Fizeau interferometer, said position sensitive detector generating an electrical output based on the position of maximum reflected power of the collimated laser radiation along said long axis of said second plate of said Fizeau interferometer.

2. A wavelength reference apparatus according to claim 1 wherein the Fizeau interferometer comprises first and second plates, the first and second plates each having a facing and non-facing side relative to said other plate, the facing sides having a partially reflective coating, the non-facing sides having an anti-reflective coating, and the first plate being at an inclination to the collimated laser radiation.

3. A wavelength reference apparatus according to claim 1 wherein the position sensitive detector comprises at least one discrete sensitive area to determine the position of maximum reflected power of the collimated laser radiation from the Fizeau interferometer.

4. A wavelength-locking apparatus for use in tuning a device such as a tunable Fabry-Perot filter or a tunable VCSEL emitting laser radiation to a precise, absolute frequency, the wavelength locking apparatus comprising:
   a collimation device for collimating a portion of the laser radiation;
   a Fizeau interferometer for receiving the collimated laser radiation, said Fizeau interferometer having a first plate and a second plate, said first plate and said second plate being set at an inclination with respect to one another, and said first plate being set at an inclination with respect to one another, and said first plate being set at an inclination with respect to an optical path of said portion of the collimated laser radiation from said collimation device;
   a position sensitive detector for determining a position of maximum reflected power of the collimated laser radiation along a long axis of said second plate of said Fizeau interferometer, said position sensitive detector generating an electrical output based on the position of maximum reflected power of the collimated laser radiation along said long axis of said second plate of said Fizeau interferometer; and
   a controller for tuning the wavelength of the device by monitoring the position of maximum reflected power on the position sensitive detector, said controller having circuitry for reading said electrical output from said position sensitive detector and for adjusting a voltage applied to said device so as to tune said device to a desired wavelength.

5. A wavelength-locking apparatus according to claim 4 wherein the Fizeau interferometer further comprises first and second plates, the first and second plates each having a facing and a non-facing side relative to said other plate, the facing sides having a partially reflective coating, the non-facing sides having an anti-reflective coating, and the first plate being at an inclination to the collimated laser radiation.

6. A wavelength-locking apparatus according to claim 4 wherein the position sensitive detector comprises at least one discrete sensitive area to determine the position of maximum reflected power of the collimated laser radiation from the Fizeau interferometer.

7. A method for tuning a device such as a tunable Fabry-Perot filter or a tunable VCSEL emitting laser radiation, comprising the steps of:
   (1) collimating laser radiation through a collimation device;
   (2) passing the collimated laser radiation into a Fizeau interferometer;
   (3) determining a position of maximum reflected power along a long axis of a plate of said Fizeau interferometer;
   (4) identifying the frequency of the laser radiation according to the position of maximum reflected power along said long axis of said plate of said Fizeau interferometer; and
   (5) using the position of the maximum reflected power along said long axis of said plate of said Fizeau interferometer to tune the device to the desired frequency.

8. A system comprising:

a tunable filter for emitting laser radiation; and a wavelength-locking apparatus for use in tuning the tunable filter to a precise, absolute frequency, the wavelength locking apparatus comprising:

a collimation device for collimating a portion of the laser radiation;

a Fizeau interferometer for receiving the collimated laser radiation, said Fizeau interferometer having a first plate and a second plate, said first plate and said second plate being set at an inclination with respect to one another, and said first plate being set at an inclination with respect to an optical path of said portion of the collimated laser radiation from said collimation device;

a position sensitive detector for determining the position of maximum reflected power of the collimated laser radiation along a long axis of said second plate of said Fizeau interferometer, said position sensitive detector generating an electrical output based on the position of maximum reflected power of the collimated laser radiation along said long axis of said second plate of said Fizeau interferometer; and a controller for tuning the wavelength of the filter by monitoring the position of maximum reflected power on the position sensitive detector, said controller circuitry for reading said electrical output from said position sensitive detector and for adjusting a voltage applied to said device so as to tune said device to a desired wavelength.

9. A system comprising:

a tunable VCSEL for emitting laser radiation; and a wavelength-locking apparatus for use in tuning the tunable VCSEL to a precise, absolute frequency, the wavelength locking apparatus comprising:

a collimation device for collimating a portion of the laser radiation;

a Fizeau interferometer for receiving the collimated laser radiation, said Fizeau interferometer having a first plate and a second plate, said first plate and said second plate being set at an inclination with respect to one another, and said first plate being set at an inclination with respect to an optical path of said portion of the collimated laser radiation from said collimation device;

a position sensitive detector for determining a position of maximum reflected power of the collimated laser radiation along a long axis of said second plate of said Fizeau interferometer, said position sensitive detector generating an electrical output based on the position of maximum reflected power of the collimated laser radiation along said long axis of said second plate of said Fizeau interferometer; and a controller for tuning the wavelength of the VCSEL by monitoring the position of maximum reflected power on the position sensitive detector, said controller having circuitry for reading said electrical output from said position sensitive detector and for adjusting a voltage applied to said device so as to tune said device to a desired wavelength.

* * * * *